United States Patent [19]

Yasui et al.

[11] Patent Number: 4,507,759
[45] Date of Patent: Mar. 26, 1985

[54] STATIC MEMORY

[75] Inventors: Tokumasa Yasui; Hideaki Nakamura, both of Kodaira; Kiyofumi Uchibori, Hachiohji; Nobuyoshi Tanimura, Musashino; Osamu Minato, Kodaira, all of Japan

[73] Assignees: Hitachi, Ltd; Hitachi Microcomputer Eng. Ltd., both of Tokyo, Japan

[21] Appl. No.: 343,590

[22] Filed: Jan. 28, 1982

[30] Foreign Application Priority Data

Feb. 2, 1981 [JP] Japan .................................. 56-12960

[51] Int. Cl.³ .............................................. G11C 7/02
[52] U.S. Cl. .................... 365/189; 365/154; 365/208
[58] Field of Search ............... 365/189, 230, 154, 203, 365/208

[56] References Cited

U.S. PATENT DOCUMENTS 4,272,834  6/1981  Noguchi et al. .................... 365/189

FOREIGN PATENT DOCUMENTS 2946803  4/1983  Fed. Rep. of Germany ...... 365/189

Primary Examiner—James W. Moffitt
Attorney, Agent, or Firm—Antonelli, Terry & Wands

[57] ABSTRACT

In a MOS static RAM, data lines disposed in a memory array and common data lines to be coupled with the data lines through a data line selection circuit are supplied with bias voltages of a level lower than a power source voltage level through bias MOSFETs. Normally, where the stand-by period of the RAM is long, the bias voltages of the data lines and the common data lines are abnormally raised by the leakage currents or tailing currents of the bias MOSFETs. As a result, the data read-out speed of the RAM is lowered. Such abnormal potential increases of the data lines and the common data lines are prevented by connecting resistance elements of comparatively high resistances (such as made of polycrystalline silicon layers), between the respective data lines and common data lines and the ground point of the circuitry.

18 Claims, 9 Drawing Figures

STATIC MEMORY

FIELD OF THE INVENTION

The present invention relates to a static memory and, more particularly, to a static random access memory constructed of insulated-gate field effect transistors (hereinbelow, termed "MOS static RAM").

BACKGROUND OF THE INVENTION

A MOS static RAM is usually provided with a sense amplifier together with a memory array composed of a plurality of static memory cells which are arranged in matrix form, a plurality of word lines with which the selection terminals of the memory cells arranged in the same rows are connected in common, and a plurality of data lines with which the data terminals of the memory cells arranged in the same columns are connected in common. A data signal of comparatively low level delivered from a selected memory cell is amplified by the sense amplifier.

In a circuit arrangement in which a data line to be selected among the plurality of data lines in the memory array is coupled to a common data lines through a column switch circuit, the sense amplifier has its input terminal connected to the common data line. In this case, the output terminal of a writing circuit is also connected to the common data line. Accordingly, in the operation of reading out data, the data signal read out from the memory cell which has been selected by the word line and the column switch circuit is supplied to the sense amplifier through a common word line, while in the operation of writing data, a data signal delivered from the writing circuit is supplied to the selected memory cell through the common word line. In the operation of reading out data, the read-out operation speed is limited by the period of time in which the potentials of the data line and the common data line are brought to predetermined values in accordance with the data signal delivered from the memory cell, and the operating characteristics of the sense amplifier.

The sense amplifier constructed of insulated-gate field effect transistors (hereinbelow, termed "MOS-FETs"), especially the sense amplifier of differential circuit form, has its sensitivity affected by the varying range of an input signal to be impressed on the input terminal thereof. When the varying range of the input signal becomes larger or smaller than a desirable varying range, the sensitivity of the sense amplifier decreases.

To increase the data read-out operation speed, the potential of the common data line before the initiation of data read-out can be preset to a desirable level by arranging a MOSFET between, for example, a power source terminal and the common data line, the MOS-FET causing a proper voltage drop of a magnitude equal to or greater than the threshold voltage thereof. Similarly, the potential of the data line can be preset to a desirable level by arranging an appropriate MOSFET between the power source terminal and the data line. In this case, since the potentials of the common data line and the data line are preset to the prescribed values in a period such as a chip non-selection period, the period of time in which these potentials are brought to the predetermined values according to the data signal delivered from the memory cell becomes comparatively short. In addition, since the highest potentials of the common data line and the data line are limited by the MOSFETs, the sensitivity of the sense amplifier is enhanced. It is consequently possible to make the data read-out speed comparatively high. However, the MOSFETs for applying the bias voltages as described above give rise to non-negligible leakage currents or tailing currents Where the chip non-selection period is comparatively long, the potentials of the common data line and the data line are increased approximately to the potential of the power source terminal by the leakage currents or tailing currents. The magnitudes of these leakage or tailing currents of the MOSFETs increase with a rise in temperature. Therefore, when the temperature rises, the potentials of the common data line and the data line are responsively increased to undesirable levels in a comparatively short time. In response to the excessive potentials of the common data line and the data line, the sensitivity of the sense amplifier is decreased, so that the data read-out speed is limited.

For an arrangement in which the sense amplifier in the differential circuit form is controlled by a chip selection signal, when the potential of the common data line is abnormally high as described above, the output voltage of this sense amplifier is decreased considerably irrespective of the level of the data read out from the memory cell, immediately after this amplifier has been brought into its operative state by the chip selection signal. The output voltage of the sense amplifier is thereafter made equal to a level corresponding to the data level delivered from the memory cell. Accordingly, the data read-out speed is also limited by such output a characteristic of the sense amplifier.

SUMMARY OF THE INVENTION

It is, accordingly, an object of the present invention to provide a MOS static RAM which can effect a stable high-speed operation.

Another object of the present invention is to provide a MOS static RAM which is compensated for temperature.

Still another object of the invention is to provide a MOS static RAM which is comparatively easy to manufacture.

Further objects of the invention will become apparent from the following description taken in conjunction with the drawings.

BRIEF DESCRIPTION OF THE DRAWINGS

FIG. 4A is a layout pattern diagram of circuit elements constituting a bias circuit shown in FIG. 1, while

DESCRIPTION OF THE PREFERRED EMBODIMENTS

Figure 1:
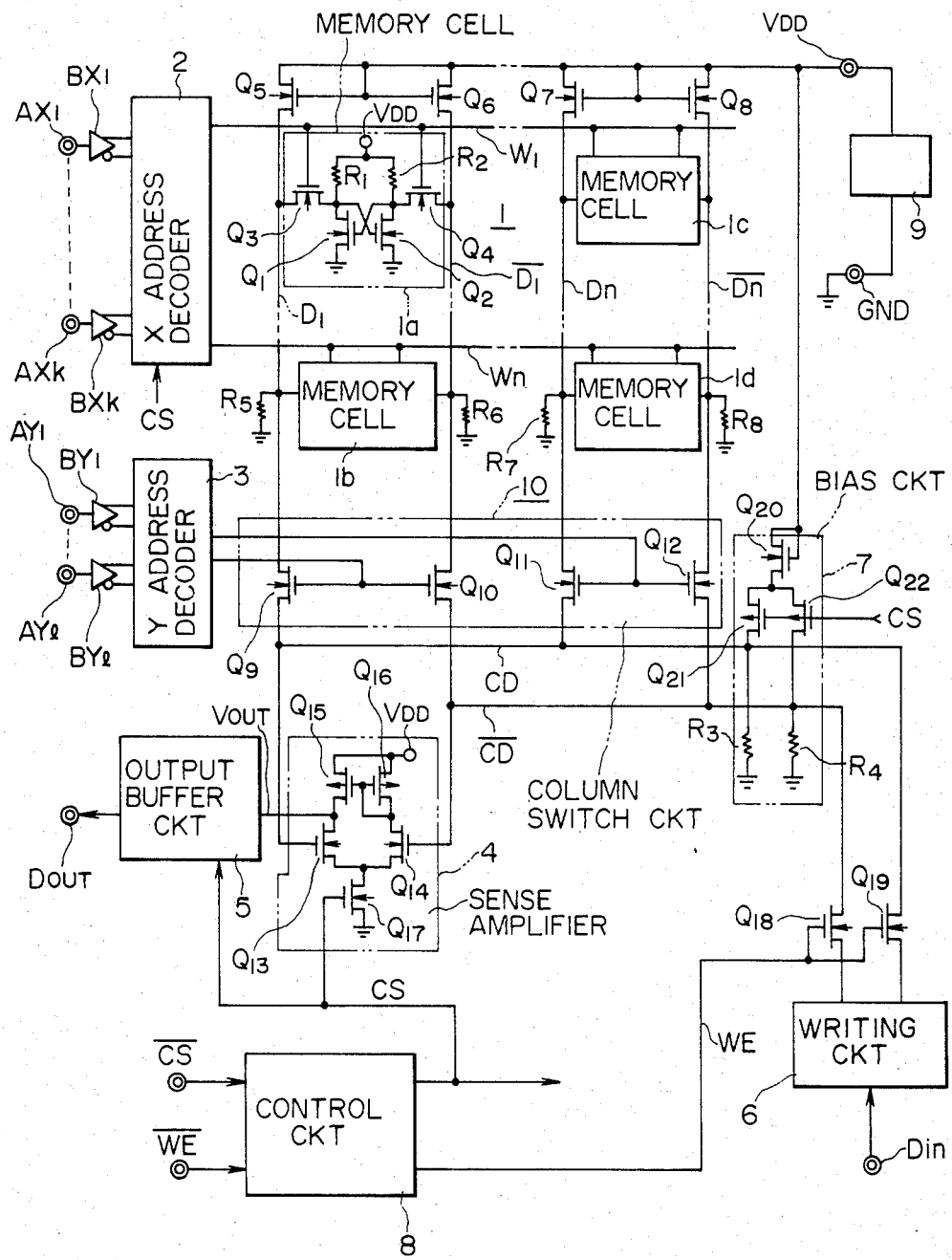
FIG. 1 is a circuit diagram showing an embodiment of the invention.

FIG. 1 shows the circuitry of a MOS static RAM of an embodiment of this invention. The RAM in the figure is wholly formed on a single semiconductor substrate by known CMOS integrated circuit technology. The Ram has external terminals $AX_1$ to $AX_k$, $AY_1$ to $AY_l$, $D_{OUT}$, $\overline{CS}$, $\overline{WE}$, $D_{in}$, $V_{DD}$ and GND, and is operated in such a way that a power source voltage is supplied from an external power source 9 across the power source terminal $V_{DD}$ and the ground terminal GND. In the figure, numeral 1 designates a memory array, which is constructed of memory cells 1a to 1d, word lines $W_1$ to $W_n$, and data lines $D_1$, $\overline{D}_1$ to $D_n$, $\overline{D}_n$.

The respective memory cells have arrangements identical to one another. Although not especially restricted, each of the memory cells is constructed, as typically illustrated in detail by the memory cell 1a, of the static flip-flop circuit which is composed of driving MOSFETs $Q_1$ and $Q_2$ having their gates and drains cross-coupled to each other and load resistors $R_1$ and $R_2$, and transfer gate MOSFETs $Q_3$ and $Q_4$ which are respectively disposed between the input and output terminals of the static flip-flop circuit and the pair of data lines $D_1$ and $\overline{D}_1$. The memory cell has the node of the load resistors $R_1$ and $R_2$ supplied with the power source voltage through the power source terminal $V_{DD}$, and is operated thereby. In the memory cell, the pair of driving MOSFETs $Q_1$ and $Q_2$ have one brought into the "on" state and the other into the "off" state in accordance with data to be stored.

Consumed current flowing through the memory cell consists of an operating current which flows through the MOSFET turned "on" in the pair of driving MOSFETs $Q_1$ and $Q_2$, and a leakage current which flows through the MOSFET turned "off". The consumed current may be reduced by increasing the resistances of the load resistors $R_1$ and $R_2$. The leakage current flowing through the driving MOSFET in the "off" state causes a voltage drop across the load resistor, and consequently lowers the voltage applied to the gate of the driving MOSFET in the "on" state. Therefore, the resistances of the load resistors $R_1$ and $R_2$ have their upper limits set by the leakage currents of the driving MOSFETs. The lower limits of the resistances of the load resistors $R_1$ and $R_2$ are set by the required consumed power characteristic of the memory cell. The load resistors $R_1$ and $R_2$ are set at a high resistance value of, for example, several megohms to several gigaohms in order to reduce the power consumption of the memory cell in the data retaining status thereof. For reducing the occupying area of the memory cell, the resistors $R_1$ and $R_2$ are constructed of, for example, polycrystalline silicon layers of comparatively high resistivity which are formed through field insulating films of comparatively great thickness on the surface of the semiconductor substrate forming the MOSFETs.

In each memory cell, the gates of the transfer gate MOSFETs $Q_3$ and $Q_4$ are regarded as the selection terminal of the corresponding memory cell, and the drains as the data terminals for receiving and delivering data. The memory cells 1a and 1d are arranged in the form of a matrix as shown in the figure. Among the memory cells 1a–1d in the matrix arrangement, cells 1a and 1c and cells 1b and 1d arranged in the same rows have their selection terminals connected to the word lines $W_1$ and $W_m$ in common, respectively, and cells 1a and 1b and cells 1c and 1d arranged in the same columns have- their pair of data terminals connected to the pair of data lines $D_1$ and $\overline{D}_1$ and data lines $D_n$ and $\overline{D}_n$ in common, respectively. The data lines $D_1$ to $\overline{D}_n$ which are disposed in correspondence with the respective memory cells columns are connected to common data lines CD and $\overline{CD}$ through transfer gate MOSFETs $Q_9$, $Q_{10}$ and $Q_{11}$, $Q_{12}$ which constitute a column switch circuit 10.

The word lines $W_1$–$W_n$ in the memory array 1 are connected to the corresponding output terminals of an X address decoder 2 and are, accordingly, selected by the X address decoder 2. The pair transfer gate MOSFETs $Q_9$ and $Q_{10}$, and $Q_{11}$ and $Q_{12}$ constituting the column switch circuit 10 have their gates connected to the corresponding output terminals of a Y address decoder 3 in common, respectively, and are selected by the Y address decoder 3. The X address decoder 2 is supplied with address signals fed to the address input terminals $AX_1$ to $AX_k$, through address buffer circuits $BX_1$ to $BX_k$. Although not especially restricted, the X address decoder 2 has its operation controlled by a control signal CS. When the control signal CS is at its low level, the word lines $W_1$–$W_m$ are brought to their non-selection level (low level) irrespective of the address signals.

The Y address decoder 3 is similarly supplied with address signals fed to the address input terminals $AY_1$ to $AY_l$, through address buffer circuits $BY_1$ and $BY_l$.

The pair of common data lines CD and $\overline{CD}$ are connected to the pair of input terminals of a sense amplifier 4 on one side, and are connected to the output terminals of a writing circuit 6 through transfer gate MOSFETs $Q_{18}$ and $Q_{19}$ on the other side. The output terminal of the sense amplifier 4 is connected to the input terminal of an output buffer circuit 5.

Although not especially restricted, the sense amplifier 4 is constructed, as shown in the figure, of a differential amplifier circuit which is composed of differential MOSFETs $Q_{13}$ and $Q_{14}$, MOSFETs $Q_{15}$ and $Q_{16}$ effecting the current mirror operation, and a MOSFET $Q_{17}$ for constant current. The MOSFET $Q_{17}$ is also operated as a power switch. When a chip selection signal which is supplied to the chip selection terminal $\overline{CS}$ is brought to its low level such as ground potential of the circuitry, the control signal which is supplied from a control circuit 8 to the gate of the MOSFET $Q_{17}$ responds thereto and goes high. As a result, the MOSFET $Q_{17}$ is tuned "on", and the sense amplifier 4 is activated.

The output buffer circuit 5 is constructed substantially of a 3-status circuit which includes the floating state of its output terminal. When the control signal CS provided from the control circuit 8 is at the low level, the output terminal of the output buffer circuit 5 is brought into the floating state. When the control signal CS is at the high level, the output terminal of the output buffer circuit 5 is brought to its low level or high level corresponding to the output level of the sense amplifier 4.

The common data lines CD and $\overline{CD}$ have also a bias circuit 7 connected thereto. As shown in the figure, the bias circuit 7 is constructed of an n-channel MOSFET $Q_{20}$ for level shift purposes, the gate and drain of which are connected to the power source terminal $V_{DD}$, p-channel MOSFETs $Q_{21}$ and $Q_{22}$ as an equalizer which are respectively connected between the source of the MOSFET $Q_{20}$ and the common data lines CD and $\overline{CD}$, and resistors $R_3$ and $R_4$ which are respectively connected between the common data lines CD and $\overline{CD}$ and the ground point of the circuitry.

The MOSFETs $Q_{21}$ and $Q_{22}$ are switch-controlled by the control signal CS so as to be "on" during the chip non-selection period. More specifically, when the signal supplied to the external terminal $\overline{CS}$ is high, the control signal CS is responsively brought to a low level such as ground potential. The MOSFETs $Q_{21}$ and $Q_{22}$ are turned "on" by the low level of the control signal CS.

Where the bias circuit 7 is not employed, the potential difference between the common data lines CD and $\overline{CD}$ as set by the memory cell selected during a proceding data read-out operation is still held by stray capacitances (not shown) which exist between these common data lines CD and $\overline{CD}$ and the ground point of the circuitry. In this case, if a data signal which is provided from the memory cell to be selected anew has the inverted level to the level of a data signal which has been provided from the memory cell selected previously, a comparatively long time will expire before the potential difference between the common data lines CD and CD reaches a new potential difference. That is, the access time of the RAM will become long.

Where the bias circuit 7 is disposed as shown in the Figure, the potential difference corresponding to the previous data as explained above is made approximately 0 (zero) by reason that the MOSFETs $Q_{21}$ and $Q_{22}$ are held in their "on" states during the chip non-selection period. When, in this manner, the potential difference between the pair of common data lines CD and $\overline{CD}$ is preset to approximately 0 (zero), the potential difference corresponding to the data of the memory cell to be selected anew can be coupled to the common data line pair CD and $\overline{CD}$ in a comparatively short time, with the result that the access time of the RAM can be made short. Since the MOSFET $Q_{20}$ in the bias circuit 7 is connected in the form of a diode, it causes a voltage drop approximately equal to its threshold voltage across its source and drain. During the chip non-selection period, therefore, the common data lines CD and $\overline{CD}$ are supplied with a voltage whose level is shifted by the MOSFET $Q_{20}$ with respect to the power source voltage of the power source terminal $V_{DD}$.

The sense amplifier 4 including the differential MOSFETs has its sensitivity usually influenced by the levels of bias potentials applied to its pair of input terminals. More specifically, where the bias voltages of the pair of input terminals of the sense amplifier 4 are raised above a desirable value, a voltage which is applied to the drain of the constant current MOSFET $Q_{17}$ is responsively raised. Where the sense amplifier 4 is operated by a comparatively low power-source voltage such as of +5 volts, the constant current MOSFET $Q_{17}$ does not exhibit an ideal constant-current characterisitic because its drain voltage is limited to a comparatively low value. The drain current of the constant current MOSFET $Q_{17}$ is therefore increased by raising its drain voltage. The increase of the drain current of the constant current MOSFET $Q_{17}$ increases the drain currents of the respective differential MOSFETs $Q_{13}$ and $Q_{14}$. In this case, when the potential of the common data line $\overline{CD}$ is lower than that of the common data line CD in accordance with the data signal provided from the memory cell, the drain current of the MOSFET $Q_{13}$ is increased and that of the MOSFET $Q_{14}$ is decreased. As a result, a comparatively satisfactory low level signal is provided at the drains of the MOSFETs $Q_{13}$ and $Q_{15}$ connected in common.

In contrast, when the potential of the common data line CD is lower than that of the common data line $\overline{CD}$, the drain current of the MOSFET $Q_{13}$ is decreased and that of the MOSFET $Q_{14}$ is increased. As a result, a high level signal is provided from the MOSFETs $Q_{13}$ and $Q_{15}$. In this case, however, the drain voltage of the MOSFET $Q_{14}$ is lowered by a voltage developing across the source and drain of the diode-connected MOSFET $Q_{16}$, with the result that the increase of the drain current of the MOSFET $Q_{14}$ is comparatively small. Owing to the comparatively small increase of the drain current of the MOSFET $Q_{14}$, the increment of a voltage to be applied across the gate and source of the MOSFET $Q_{15}$ is limited to be comparatively small. As a result, the increment of the drain current of the MOSFET $Q_{15}$ becomes comparatively small. Notwithstanding the fact that the drain current of the MOSFET $Q_{13}$ is increased by the increase of the drain current of the constant current MOSFET $Q_{17}$, the increase of the drain current of the MOSFET $Q_{15}$ is made comparatively small, and hence, the high level signal to be provided from the MOSFETs $Q_{13}$ and $Q_{15}$ is made comparatively low level.

The level lowering of the high level signal, at the time when the bias voltages of the pair of input terminals have been raised, becomes considerable when increasing the gain of the sense amplifier 4 by making comparatively low the drain - source conductances of the MOSFETs $Q_{15}$ and $Q_{16}$ as the drain loads of the respective MOSFETs $Q_{13}$ and $Q_{14}$, in other words, when making the MOSFETs $Q_{15}$ and $Q_{16}$ comparatively small in size. When the level of the high level signal of the sense amplifier 4 is lowered, the output buffer circuit 5 fails to execute a desirable operation.

Where the bias voltages of the pair of input terminals are lowered below the desirable value, the drain current of the constant current MOSFET $Q_{17}$ is decreased. In response to the decrease of the drain current of the constant current MOSFET $Q_{17}$, a charging current to be supplied to the input capacitance (now shown) of the output buffer circuit 5 through the MOSFET $Q_{15}$ or a discharging current to be coupled into the input capacitance through the MOSFET $Q_{13}$ decreases. As a result, the operation speed of the sense amplifier is limited.

The sensitivity of a sense amplifier in a latch circuit arrangement, that is, the sensitivity of a sense amplifier including a pair of input MOSFETs having their gates and drains cross-coupled with each other, increases by raising the input bias voltages because the input MOSFETs have large conductances. For the circuit arrangement shown in FIG. 1, the potentials of the common data lines CD and $\overline{CD}$ are lowered to the appropriate levels by the MOSFET $Q_{20}$, so that the sense amplifier 4 operates at a high sensitivity. As a result, the output of the sense amplifier 4 reaches an appropriate level corresponding to the data supplied to the common data lines CD and $\overline{CD}$ within a comparatively short time.

Where, for example, the MOSFET $Q_{20}$ has been removed from the bias circuit 7, the common data lines CD and $\overline{CD}$ have their respective potentials raised substantially to the potential of the power source terminal $V_{DD}$ when the MOSFETs $Q_{21}$ and $Q_{22}$ are turned "on". Even where the MOSFET $Q_{20}$ is provided, the common data lines CD and $\overline{CD}$ have their respective potentials raised undesirably when the resistors $R_3$ and $R_4$ are not provided.

Figure 3:
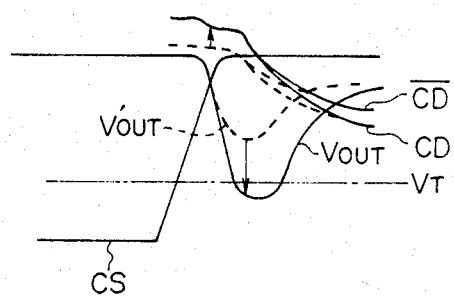
FIG. 3 is an operational waveform diagram of a sense amplifier shown in FIG. 1.

Examples of the potential variations of the common data lines CD and $\overline{CD}$, at the time when the potentials of these common data lines CD and $\overline{CD}$ have been raised to the power source voltage in advance, are indicated in FIG. 3 as solid-line curves CD and $\overline{CD}$. In this case, the potential difference to be coupled to the common data lines CD and $\overline{CD}$ by the selected memory cell exhibits only a comparatively small value because the MOSFETs in the memory cell are made comparatively small in size. Although this is not essential, current is caused to flow from one common data line $\overline{CD}$ to be made the high level to the other common data line CD to be made the low level through the MOSFETs $Q_{21}$ and $Q_{22}$ on account of the delays of the "off" times of the equalizer MOSFETs $Q_{21}$ and $Q_{22}$. As a result, also the potential of the common data line $\overline{CD}$ to be made the high level is somewhat lowered as depicted in FIG. 3.

Where the control signal CS to be supplied to the constant current MOSFET $Q_{17}$ is at a high level at a comparatively early time in order to permit the data of the memory cell to be read out at a comparatively high speed, the sense amplifier 4 is activated by this control signal CS before a sufficient level difference is given between the common data lines CD and $\overline{CD}$ by the selected memory cell. Herein, since the level difference of the common data lines CD and $\overline{CD}$ is small, the differential MOSFETs $Q_{13}$ and $Q_{14}$ are simultaneously made conductive, with the result that the output of the sense amplifier 4 is temporarily lowered.

Where the common data lines CD and $\overline{CD}$ have been raised undesirably as described above, the drain current of the constant current MOSFET $Q_{17}$ is comparatively increased as explained above. The output voltage $V_{OUT}$ of the sense amplifier 4 is therefore lowered greatly as indicated by a solid-line curve $V_{OUT}$ in FIG. 3 when the constant current MOSFET $Q_{17}$ has been turned "on" by the control signal CS (solid-line curve CS in FIG. 3), even if the output voltage $V_{OUT}$ ought to be at a high level. This output voltage $V_{OUT}$ is changed to the high level again as seen from the solid-line curve $V_{OUT}$ because a comparatively large level difference exists between the common data lines CD and $\overline{CD}$. When the output voltage $V_{OUT}$ of the sense amplifier 4 has become lower than the logic threshold voltage $V_T$ of the output buffer circuit 5, the output of the output buffer circuit 5 is temporarily inverted, even where the data of the high level is read out from the memory cell. It is therefore inevitable that the read-out timing of the data is late.

In contrast, when the bias circuit 7 is provided with the level shifting MOSFET $Q_{20}$ as shown in FIG. 1, the levels of the common data lines CD and $\overline{CD}$ are thereby lowered as depicted by broken lines in FIG. 3. Therefore, the magnitude of decrease of the output voltage $V_{OUT}$ of the sense amplifier 4 in the activation of this amplifier is reduced as indicated by a broken-line curve in FIG. 3. Consequently, data may be read out from the memory cell at high speed.

In this embodiment, resistors $R_3-R_4$ are disposed in order to stably enhance the speed of the read-out operation, in other words, to prevent the level rises of the common data lines attributed to the leakage (or tailing) current of the level shifting MOSFET $Q_{20}$. The resistors $R_3$ and $R_4$ are disposed between the respective common data lines CD and $\overline{CD}$ and the reference potential (0 V).

In order to prevent an increase in the power consumption of the RAM during chip non-selection, the resistors $R_3$ and $R_4$ have their combined resistance values set a comparatively high resistance value which can cause a supply of current substantially equal to or somewhat greater than the leakage current of the level shifting MOSFET $Q_{20}$.

The resistors $R_3$ and $R_4$ can be constructed of, for example, diode-connected MOSFETs. It is desirable, however, that, like the resistors $R_1$ and $R_2$ in the memory cell, the resistors $R_3$ and $R_4$ be constructed of polycrystalline silicon layers (now shown) which are formed on the semiconductor substrate through field insulating films of comparatively great thickness. Where the resistors $R_3$ and $R_4$ are constructed of polycrystalline silicon layers in this manner, their occupying areas can be made comparatively small because the polycrystalline silicon layers can be controlled to exhibit a comparatively high resistivity. In addition, the resistor constructed of the polycrystalline silicon layer does not have a stray capacitance of comparatively great value as in the drain or source junction of a MOSFET because it is formed on the semiconductor substrate through the field insulating film which is made of, for example, a silicon dioxide film. Therefore, the resistors made of the polycrystalline silicon layers impart only comparatively small stray capacitances to the common data lines CD and $\overline{CD}$ and do not substantially limit the signal variation speeds on these common data lines CD and $\overline{CD}$.

According to the circuit of the embodiment in FIG. 1, even when the leakage current of the MOSFET $Q_{20}$ for setting the bias potentials of the common data lines CD and $\overline{CD}$ exists at, for example, a long chip non-selection period of a high temperature, it is absorbed by the high resistances $R_3$ and $R_4$, so that the bias voltages can be prevented from increasing. In the activation of the sense amplifier 4 based on the turn-on of the power switch MOSFET $Q_{17}$, accordingly the bias voltages of the common data lines CD and $\overline{CD}$ are fixed to be constant, and hence the drop in the output signal $V_{OUT}$ becomes small and constant as depicted by the broken lines in FIG. 3. Thus, the stable enhancement of the speed of the read-out operation can be realized.

In FIG. 1, enhancement-mode MOSFETs $Q_5$, $Q_6$, $Q_7$ and $Q_8$ for data line loads are respectively disposed between the data lines $D_1$, $\overline{D}_1$, $D_n$ and $\overline{D}_n$ and the power source terminal $V_{DD}$. In addition, resistors $R_5$, $R_6$, $R_7$ and $R_8$ constructed of polycrystalline silicon layers and having a purpose similar to that of the resistors $R_3$ and $R_4$ are disposed between the respective data lines and the ground point of the circuitry. Accordingly, the respective data lines are supplied with voltages whose levels have been shifted by the MOSFETs for the data line loads. Since the leakage currents of the load MOSFETs $Q_5$, $Q_6$ etc. can be absorbed by the similar high resistances $R_5$, $R_6$ etc., level increases of the data lines $D_1$, $\overline{D}_1$ etc. can be prevented.

In the above description, among the MOSFETs. $Q_1-Q_{22}$, MOSFETs the channel region parts of which are assigned arrows toward the gates as in, for example, the MOSFET $Q_1$ are n-channel MOSFETs, and MOSFETs the channel region parts of which are assigned arrows in the sense reverse to the gates as in, for example, the MOSFET $Q_{15}$ are p-channel MOSFETs. Accordingly, the circuit of this embodiment is constructed of a C-MOS (complementary MOS) circuit. The illustrated n-channel MOSFETs have their body gates coupled to the ground potential of the circuitry, while the p-channel MOSFETs have their body gates coupled to the power source terminal $V_{DD}$.

Figure 2B:
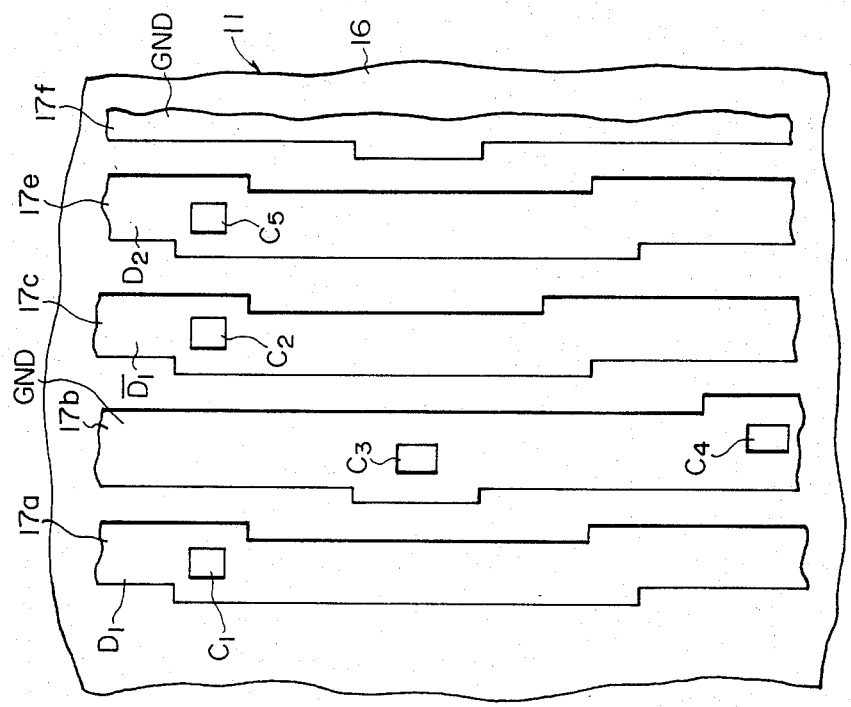
FIG. 2B is a layout pattern diagram of wiring layers corresponding to the layout pattern in FIG. 2A.
Figure 2A:
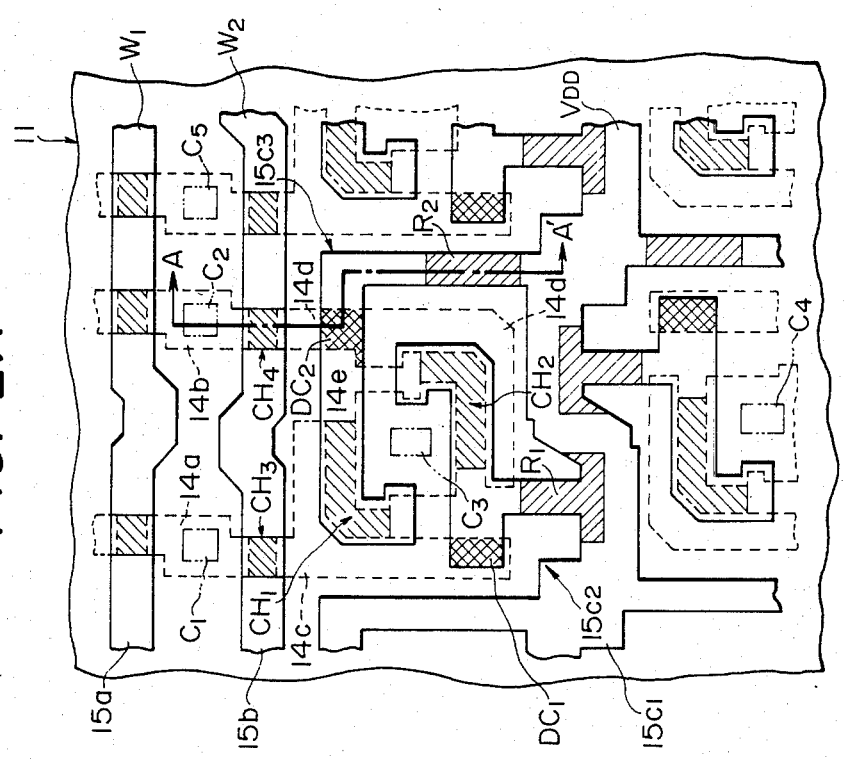
FIG. 2A is a layout pattern diagram of memory cells.
Figure 2C:
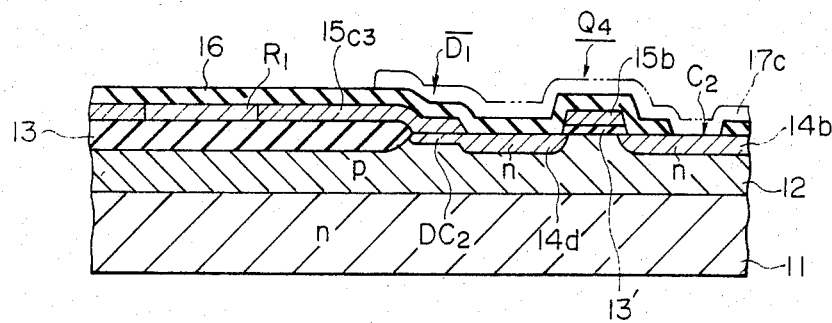
FIG. 2C is a sectional view of a semiconductor substrate seen as indicated by arrows A—A' in FIG. 2A.

Although not especially restricted, the memory cells may have a structure as illustrated in FIGS. 2A and 2C. FIG. 2A shows the layout pattern of the memory cells before evaporated aluminum layers are formed, and FIG. 2B the layout pattern of the evaporated aluminum layers. FIG. 2C shows a sectional view of the part of a semiconductor substrate seen in the direction of arrows A—A' in FIG. 2A.

The semiconductor substrate 11 shown in FIG. 2C is a single-crystal silicon substrate, for example, having a resistivity of 10 $\Omega$ cm and with its surface being parallel to the crystal plane (100). That part of the surface of the semiconductor substrate 11 which is to form the memory array is made a p-type well region 12 of a depth of, e.g., 4 $\mu$m which is formed by the implantation of boron ions and the subsequent drive-in diffusion. Those parts of the surface of the semiconductor substrate 11 which are other than surface parts corresponding to active regions such as MOSFET forming regions and semiconductor wiring regions are formed with field oxide films 13 having a comparatively large thickness of, e.g., about 0.95 $\mu$m by known selective oxidation. The surface of the p-type well region 12 is formed with n-type semiconductor regions $14b$, $14d$ etc. which serve as the drain region and source region of the MOSFET. On the channel region of the MOSFET, a gate oxide film 13' having a comparatively small thickness of, e.g., about 50 nm is formed. The field oxide film 13 and the gate oxide film 13' are overlaid with polycrystalline silicon layers $15b$, $15c_3$ etc. which have a thickness of, e.g., about 0.35 $\mu$m and which serve as a wiring and a gate electrode. The polycrystalline silicon layer $15c_3$ is directly coupled with the n-type semiconductor region 14D. In addition, the polycrystalline silicon layer $15c_3$ has a portion $R_1$ which does not substantially contain a conductivity type-determining impurity. The portion $R_1$ is utilized as a high resistance element. The surface of the semiconductor substrate 11 is covered with an insulating film 16 which is, e.g., about 0.6 $\mu$m thick and made of phosphosilicate glass.

Although not especially restricted, the structure shown in FIG. 2C can be obtained by the following method of manufacture. First, the semiconductor substrate 11 which is formed with the p-type well region 12 and then with the field oxide film 13 is prepared. The surface parts to form the active regions, that is, the semiconductor substrate surface parts which are not covered with the field oxide film 13 are formed with the thin oxide film to serve as the gate oxide films of the p-channel MOSFETs and n-channel MOSFETs. Those parts of the thin oxide film formed which correspond to direct contact portions as shown by $DC_2$ in FIG. 2C are removed by the selective etching.

The surface of the resultant semiconductor substrate 11 is formed with a polycrystalline silicon layer by the known chemical vapor deposition (CVD). On the polycrystalline silicon layer formed, a first silicon oxide film being, e.g., about 0.3 $\mu$m thick is formed by the CVD. This silicon oxide film is used as a mask in the case of diffusing an n-type impurity into the polycrystalline silicon layer. The first silicon oxide film is selectively etched and removed so as to be left on those parts of the polycrystalline silicon layer in which the high resistance elements $R_1$ etc. are to be formed. Subsequently, phosphorus as the n-type impurity is diffused into the polycrystalline layer. In this case, the first silicon oxide film functions as the impurity diffusion mask, and hence, the phosphorus is not diffused into those parts of the polycrystalline silicon layer which correspond to the high resistance elements $R_1$ etc.

Next, the polycrystalline silicon layer other than its parts which are to form the wiring layers, the high resistance elements and the gate electrodes of the p-channel and n-channel MOSFETs is etched and removed by the selective etching. On the surface of the semiconductor substrate 11, a second silicon oxide film for an impurity diffusion mask is formed by the CVD again. Those parts of the second silicon oxide film which overlie the substrate parts to form the p-channel MOSFETs and p-type polycrystalline silicon wiring layers are selectively etched and removed. In this etching step, the polycrystalline silicon layer and the field oxide films function substantially as an etching mask. As a result, the gate oxide films overlying those parts of the semiconductor substrate surface in which the drain regions and source regions of the p-channel MOSFETs are to be formed are etched and removed.

Subsequently, boron is diffused into the exposed polycrystalline layer and semiconductor substrate surface as a p-type impurity. Thus, p-type semiconductor regions as the drain regions and source regions of the p-channel MOSFETs are formed in the surface of the semiconductor substrate. Since the polycrystalline silicon layer and the field oxide films function as the impurity diffusion mask, the p-type semiconductor regions are self-aligned with respect to the polycrystalline silicon layer and the field oxide films. The polycrystalline silicon layer having been made the n-type by the previous diffusion of the n-type impurity is turned into the p-type by the diffusion of the boron.

After removing the second silicon oxide film, a third silicon oxide film for an impurity diffusion mask is formed on the surface of the semiconductor substrate by the CVD. Those parts of the third silicon oxide film which overlie the substrate parts to form the n-channel MISFETs and n-type polycrystalline silicon wiring layers are selectively etched and removed. In this etching step, the gate oxide films overlying those parts of the p-type well region surface in which the drain regions and source regions of the n-channel MOSFETs are to be formed are also etched and removed.

Subsequently, phosphorus as an n-type impurity is diffused into the exposed polycrystalline silicon layer and p-type well region surface. Thus, n-type semiconductor regions as the drain regions and source regions of the n-channel MOSFETs are formed in the surface of the p-type well region. The impurity is not introduced into those parts of the polycrystalline silicon layer which correspond to the high resistance elements $R_1$ etc., because the second and third silicon oxide films function as the impurity diffusion mask.

After etching and removing the third silicon oxide film, an oxide film having a thickness of, e.g., 400 Å (light oxide film, not shown) is formed on the exposed polycrystalline layer by the thermal oxidation. Subsequently, the insulating film 16 made of phosphosilicate glass is formed on the surface of the resultant semiconductor substrate. Since the light oxide film is formed, phosphorus in the insulating film 16 is not diffused into the polycrystalline layer. Next, the contact holes as shown in FIG. 2C are provided in the insulating film 16 and the underlying light oxide film (not shown) by the selective etching. An evaporated aluminum layer having a thickness of, e.g., 0.8 $\mu$m is formed on the surface of the semiconductor substrate, and it is thereafter selectively etched and removed.

In FIG. 2A, the n-type semiconductor regions are indicated by broken-line patterns 14a–14d, and the finished polycrystalline silicon layers by solid-line patterns. Parts with rightward rising hatching as in areas $CH_1$ and $CH_2$ indicate the channel regions of the MOSFETs, while parts with crosshatching as in areas $DC_1$ and $DC_2$ indicate the direct contact portions where the polycrystalline silicon layers and the n-type semiconductor regions are directly coupled. Parts with leftward rising hatching as in areas $R_1$ and $R_2$ indicate those portions of the polcrystalline silicon layers in which substantially no impurity is introduced, that is, the portions which serve as the high resistance elements.

The polycrystalline silicon layer 15b forms the word line $W_2$, and also acts as the gate electrodes of the transfer gate MOSFETs in the memory cell. The transfer gate MOSFET $Q_3$ as shown in FIG. 1 is constructed of the n-type semiconductor region 14a, the channel region $CH_3$, the polycrystalline silicon layer 15b extended on the channel region $CH_3$, and the n-channel semiconductor region 14c. Likewise, the transfer gate MOSFET $Q_4$ is constructed of the n-type semiconductor regions 14b and 14d, the channel region $CH_4$, and the polycrystalline silicon layer 15b. The driving MOSFET $Q_1$ is constructed of the n-type semiconductor regions 14c and 14e, the channel region $CH_1$ and the polycrystalline silicon layer $15c_3$, while the driving MOSFET $Q_2$ is constructed of the n-type semiconductor regions 14d and 14e, the channel region $CH_2$ and the polycrystalline silicon layer $15c_2$.

The polycrystalline silicon layer $15c_2$ is directly coupled with the n-type semiconductor region 14c serving as the source region and drain region of the MOSFETs $Q_3$ and $Q_1$ in the contact portion $DC_1$, while the polycrystalline silicon layer $15c_3$ is directly coupled with the n-type semiconductor region serving as the source region and drain region of the MOSFETs $Q_4$ and $Q_2$ in the contact portion $DC_2$. One memory cell is constructed as thus far described.

The polycrystalline silicon layer $15c_1$ forms the power source wiring layer $V_{DD}$, and is continuous to the polycrystalline silicon layers $15c_2$ and $15c_3$ of the memory cell. The n-type semiconductor regions 14a, 14b, 14e etc. are provided with contact portions $C_1$, $C_2$, $C_3$ etc. On the insulating film 16 shown in FIG. 2C, evaporated aluminum layers 17a and 17f in a pattern as shown in FIG. 2B are extended. The evaporated aluminum layer 17a is coupled with the n-type semiconductor region 14a in the contact portion $C_1$, and constructs the data line $D_1$ in one memory cell (column). Likewise, the evaporated aluminum layer 17c is coupled with the n-type semiconductor region 14b in the contact portion $C_2$ and forms the data line $\overline{D}_1$ in one memory cell (column). The evaporated aluminum layer 17b is coupled with the n-type semiconductor region 14e serving as the common source region of the MOSFETs $Q_1$ and $Q_2$ in the contact portion $C_3$, and forms the ground wiring GND. The evaporated aluminum layer 17e forms the data line $D_2$ in the next memory cell (column).

Although not especially restricted, the pattern of memory cells in one memory cell row and the pattern of memory cells in another memory cell row adjacent thereto are made substantially symmetric as shown in FIG. 2A.

Figure 4A:
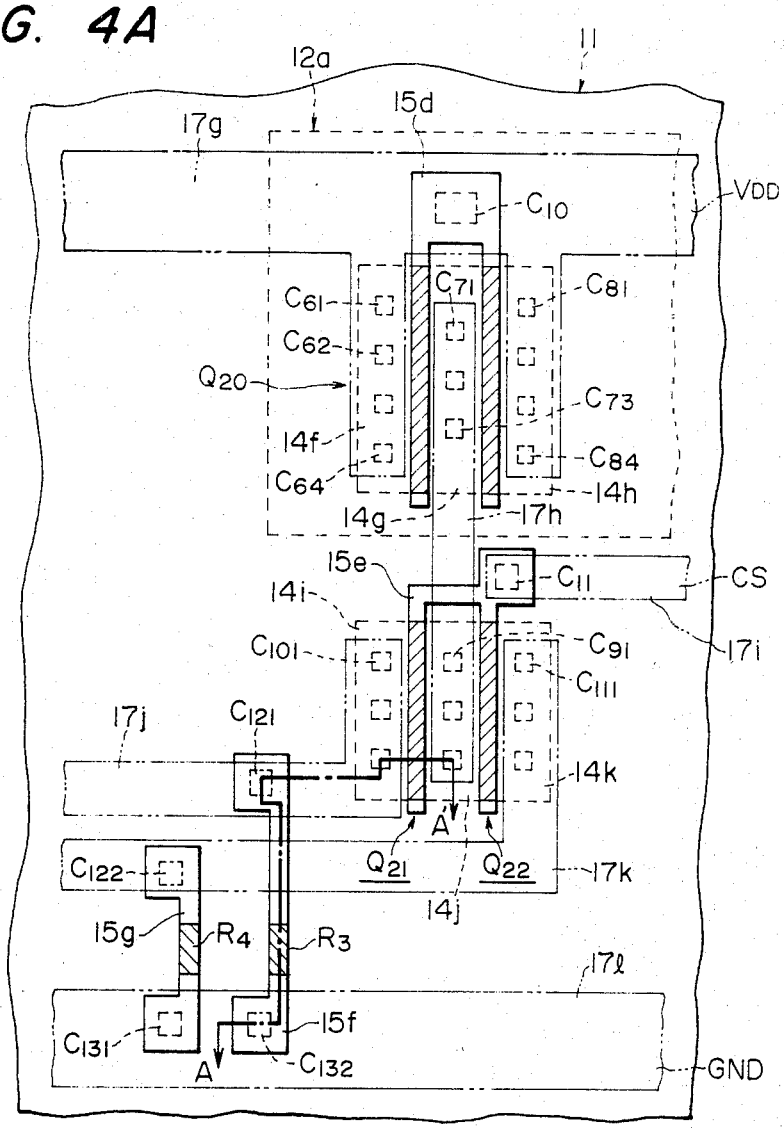
Figure 4B:
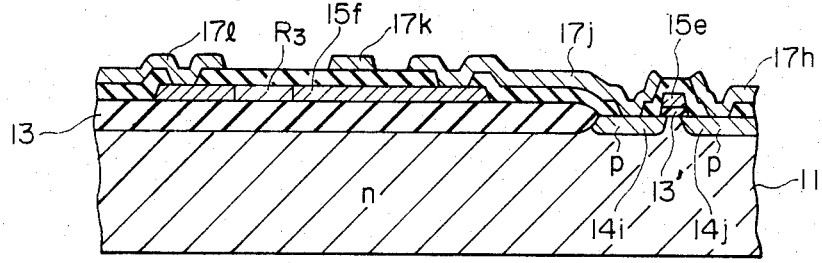
FIG. 4B is a sectional view of a semiconductor substrate seen as indicated by arrows A—A' in FIG. 4A, and FIGS. 5 and 6 are circuit diagrams of essential portions each showing another embodiment of the invention.

FIG. 4a shows the layout pattern of the respective elements constituting the bias circuit 7 shown in FIG. 1, while FIG. 4B shows the section of a semiconductor substrate portion seen in the direction of arrows A—A' in FIG. 4A. In FIG. 4A, semiconductor regions such as a p-type well region 12a and the drain and source regions of a p-channel MOSFET and n-channel MOSFET have their patterns indicated by broken lines, and polycrystalline silicon layers have their patterns indicated by solid lines. In addition, evaporated aluminum layers have their patterns indicated by two-dot chain lines. These regions are formed simultaneously with the respective regions which constitute the memory array.

The n-channel MOSFET $Q_{20}$ is constructed of n-type drain regions 14f and 14h and an n-type source region 14g which are formed in the surface of the p-type well region 12a, and an n-type polycrystalline silicon layer 15d which serves as a gate electrode. The p-channel MOSFET $Q_{21}$ is constructed of a p-type drain region 14i and a p-type source region 14j which are formed in the surface of the semiconductor substrate 11, and a p-type polycrystalline silicon layer 15e which serves as a gate electrode, while the p-channel MOSFET $Q_{22}$ is constructed of a p-type drain region 14k, the p-type source region 14j and the polycrystalline silicon layer 15e. The drain regions 14f and 14h of the MOSFET $Q_{20}$ are coupled to an evaporated aluminum layer 17g serving as the power source wiring $V_{DD}$ through contact portions $C_{61}$ to $C_{64}$ and $C_{81}$ to $C_{84}$. Similarly, the polycrystalline silicon layer 15d is coupled to the evaporated aluminum layer 17g through a contact portions $C_{10}$. The drain region 14g of the MOSFET $Q_{20}$ is coupled to an evaporated aluminum layer 17h through contact portions $C_{71}$ to $C_{73}$. The evaporated aluminum layer 17h is coupled to the common source region 14j of the MOSFETs $Q_{21}$ and $Q_{22}$ through contact portions $C_{91}$ etc. The polycrystalline silicon layer 15e is coupled through a contact portion $C_{11}$ to an evaporated aluminum layer 17i which is supplied with the control signal CS.

The drain regions 14i and 14k of the MOSFETs $Q_{21}$ and $Q_{22}$ are respectively coupled to evaporated aluminum layers 17j and 17k serving as the common data lines through contact portions $C_{101}$ etc. and $C_{111}$ etc. Polycrystalline silicon layers 15f and 15g are disposed on the field oxide film 13. The polycrystalline silicon layer 15f has its one end coupled to the evaporated aluminum layer 17j through a contact portion $C_{121}$, while the polycrystalline silicon layer 15g has its one end similarly coupled to the evaporated aluminum layer 17k through a contact portion $C_{122}$. The polycrystalline silicon layers 15f and 15g have the respective other ends coupled to an evaporated aluminum layer 17l serving as the ground wiring GND through contact portions $C_{131}$ and $C_{132}$. Like the polycrystalline silicon layers shown in FIGS. 2A and 2C, the polycrystalline silicon layers 15f and 15g have portions $R_3$ and $R_4$ in which substantially no impurity is introduced, respectively. The remaining portions of the polycrystalline silicon layers 15f and 15g are made the n-type.

Regarding the biasing n-channel MOSFET $Q_{20}$, the tailing current between the drain and source thereof is proportional to the area of the drain regions thereof. Where the length and width of the drain regions 14f and 14h and source region 14g and 50 $\mu$m and 9 $\mu$m, respectively, the tailing current has a magnitude of about $10^{-10}$ amperes at 100° C. Herein, this tailing current is absorbed comparatively well by providing a comparatively great resistance on the order of $10^{11}$ $\Omega$ to each of the polycrystalline silicon layers 15f and 15g. In this case, the length and width of the portions $R_3$ and $R_4$ in the polycrystalline silicon layers 15f and 15g are respectively made, for example, 5 $\mu$m and 3 $\mu$m.

Figure 5:
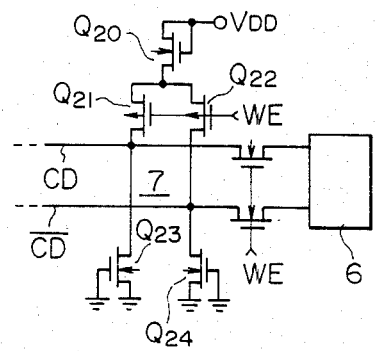

FIG. 5 shows a circuit of another preferred embodiment of this invention. In this embodiment, instead of the polycrystalline silicon high resistances $R_3$ and $R_4$ in the foregoing embodiment for absorbing the leakage current of the MOSFET $Q_{20}$ in the bias circuit 7, MOSFETs $Q_{23}$ and $Q_{24}$ whose gates and sources are connected are disposed between the common data lines CD and $\overline{CD}$ and the reference potential. The MOSFETs $Q_{23}$ and $Q_{24}$ cause drain leakage currents which absorb the leakage current of the MOSFET $Q_{20}$. As a result, in spite of the leakage current of the MOSFET $Q_{20}$, the potentials of the common data lines CD and $\overline{CD}$ are made desirable values as in the foregoing embodiment. The MOSFETs $Q_{23}$ and $Q_{24}$ should more desirably have a structure in which the combined drain leakage current thereof becomes greater than the leakage current of the MOSFET $Q_{20}$. In other words, it is more desirable that the size of the drain regions of the MOSFETs $Q_{23}$ and $Q_{24}$ be equal to or greater than the size of the drain region of the MOSFET $Q_{20}$.

The MOSFETs $Q_{23}$ and $Q_{24}$ can have a channel type opposite to that of the MOSFET $Q_{20}$. It is desirable, however, that the MOSFETs $Q_{23}$ and $Q_{24}$ have the same channel type as the MOSFET $Q_{20}$ and that they be manufactured simultaneously with the MOSFET $Q_{20}$. Under these conditions, the leakage current levels of the MOSFETs $Q_{23}$ and $Q_{24}$ correspond favorably to the leakage current level of the MOSFET $Q_{20}$ irrespective of their deviations and temperature-dependencies.

As a result, undesirable potential increases of the common data lines can be favorably prevented. Although no illustration is made, the resistors $R_5$, $R_6$, $R_7$, $R_8$ etc. in FIG. 1 can also be replaced with MOSFETs similar to the MOSFETs $Q_{23}$ and $Q_{24}$ in FIG. 5.

Figure 6:
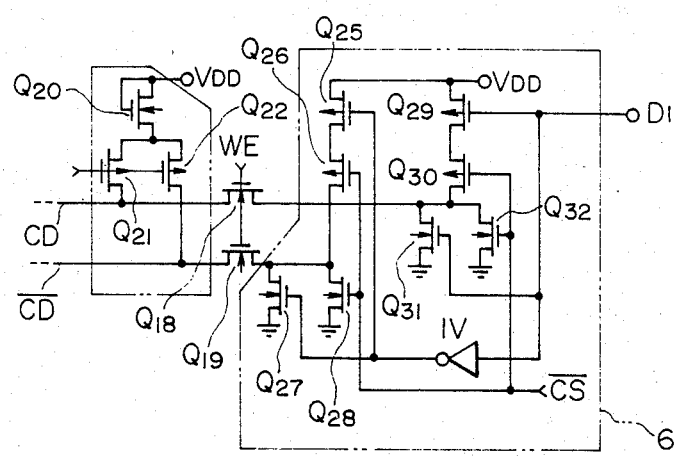

FIG. 6 shows a circuit of still another embodiment of this invention. In this embodiment, the MOSFETs $Q_{18}$ and $Q_{19}$ for transmitting write-down signals are held in their "off" states by the control signal WE during chip non-selection, and their leakage currents are utilized to prevent excessive increases of the potentials of the common data lines CD and $\overline{CD}$.

The writing circuit 6 is therefore constructed of a NAND (or NOR) gate circuit having 2 inputs so that both the pair of output terminals may be held at the low level during the chip non-selection.

More specifically, the writing circuit 6 is constructed, as shown in the figure, of a first 2-input gate circuit composed of MOSFETs $Q_{25}$–$Q_{28}$, a second 2-input gate circuit composed of MOSFETs $Q_{29}$–$Q_{32}$, and an inverter circuit IV. The chip selection signal $\overline{CS}$ is applied in common to the gates of the MOSFETs $Q_{26}$, $Q_{28}$ and $Q_{30}$, $Q_{32}$ which are the inputs of the first and second gate circuits on one side. The write input signal $D_{IN}$ is applied to the gates of the MOSFETs $Q_{29}$ and $Q_{31}$ which are the inputs of the second gate circuit on the other side. A write input signal $\overline{D_{IN}}$ inverted by the inverter circuit IV is applied to the gates of the MOSFETs $Q_{25}$ and $Q_{27}$ which are the inputs of the first gate circuit on the other side.

In the circuit of this embodiment, the chip selection signal $\overline{CS}$ is held at the high level during the chip non-selection, so that the MOSFETs $Q_{28}$ and $Q_{32}$ are held in their "on" states, while the MOSFETs $Q_{26}$ and $Q_{30}$ are in their "off" states. Consequently, both the outputs of the first and second gate circuits respectively have low level irrespective of the write signal $D_{IN}$.

During chip non-selection, accordingly, the leakage current supplied from the MOSFET $Q_{20}$ to the common data lines CD and $\overline{CD}$ through the MOSFETS $Q_{21}$ and $Q_{22}$ is coupled to the reference potential side through the MOSFETs $Q_{18}$ and $Q_{19}$ held in their "off" states and the MOSFETs $Q_{32}$ and $Q_{28}$ held in their "on" states at this time. As a result, the bias voltages on the common data lines can be prevented from increasing. During the chip selection, the MOSFETs $Q_{26}$ and $Q_{30}$ are held in their "on" states and the MOSFETs $Q_{28}$ and $Q_{32}$ in their "off" states by the low level of the chip selection signal CS, so that the output levels of the writing circuit 6 are determined in accordance with the write signal $D_{IN}$.

The circuit of this embodiment can favorably prevent the undesirable increases of the potentials of the common data lines, as in the embodiment shown in FIG. 5. In addition, according to the present embodiment, the elements which increase stray capacitances as in the preceding embodiment are not coupled to the common data lines CD and $\overline{CD}$. It is therefore possible to make the speed of read-out of data high.

The present invention is not restricted to the foregoing embodiments. The memory cell may be any type as long as it utilizes a static flip-flop circuit. Each circuit including the memory cell may be constructed of only p-channel or n-channel MOSFETs, besides the C-MOS circuit. Further, where the level rises of the data lines as described above are not an important problem, as in the case where the capacitance value of the common data lines is large relative to that of the data lines, the resistors $R_5$–$R_8$ etc. for the leakage current absorption with which the data lines are provided may well be omitted. The designations and signal levels of the signals CS and $\overline{CS}$, WE etc. in the embodiments can be variously altered.

While we have shown and described several embodiments in accordance with the present invention, it is understood that the same is not limited thereto but is susceptible of numerous changes and modifications as known to a person skilled in the art, and we therefore do not wish to be limited to the details shown and described herein but intend to cover all such changes and modifications as are obvious to one or ordinary skill in the art.

What is claimed is:

1. A static memory comprising:
    a static memory cell which has a selection terminal and a data terminal,
    a signal line which is supplied with a data signal delivered from said static memory cell,
    a sense amplifier which is supplied with said data signal through said signal line,
    a bias circuit connected between a power source line and said signal line which includes a MOSFET for applying a bias voltage to said signal line, said bias voltage having a value lowered with respect to a power source voltage fet to said power source line, and
    resistance means for coupling a current, of a value substantially equal to or somewhat greater than the leakage current developed by said MOSFET, between said MOSFET and a reference potential point of the circuitry.

2. A static memory according to claim 1, wherein said resistance means is constructed of a polycrystalline sillicon layer formed on a semiconductor substrate in which said static memory cell, said sense amplifier and said bias circuit are formed.

3. A static memory according to claim 1, wherein said resistance means is constructed of a MOSFET formed in a semiconductor substrate in which said static memory cell, said sense amplifier and said bias circuit are formed.

4. A static memory according to claim 3, wherein said MOSFET serving as said resistance means has the same channel conductivity type as that of said MOSFET in said bias circuit.

5. A static memory according to claim 4, wherein said MOSFET serving as said resistance means has its gate coupled to its source.

6. A static memory comprising:
   a plurality of static memory cells which are arranged in the form of a matrix and each of which has a selection terminal and a pair of data terminals.
   a plurality of word lines each of which is connected in common with the selection terminals of the static memory cells,
   a plurality of paired data lines each of which is connected in common with respective paired data terminals of the static memory cells,
   a pair of common data lines,
   a switch circuit which couples the paired data line, to be selected among said plurality of paired data lines, to said pair of common data lines,
   a sense amplifier which has a pair of input terminals coupled to said pair of common data lines,
   a bias circuit connected between a power source line and said pair of common data lines which includes a MOSFET for applying bias voltages to said pair of common data lines, said bias voltages having values lowered with respect to a power source voltage fed to said power source line, and
   resistance means for coupling a current, of a value substantially equal to or somewhat greater than a leakage current developed by said MOSFET, between said MOSFET and a reference potential point of the circuitry.

7. A static memory according to claim 6, wherein each static memory cell includes a pair of MOSFETs whose gates and drains are cross-coupled to each other, and a pair of resistance elements which are made of polycrystalline silicon layers and which are respectively connected to the drains of said pair of MOSFETs, and wherein said resistance means is constructed of a polycrystalline silicon layer.

8. A static memory according to claim 6, wherein said resistance means is constructed of a MOSFET.

9. A static memory according to claim 8, wherein said MOSFET serving as said resistance means has the same channel conductivity type as that of said MOSFET in said bias circuit.

10. A static memory according to claim 6, wherein said bias circuit further includes a pair of MOSFETs which are switch-controlled by a chip selection signal, and wherein said pair of common data lines are brought to potentials equal to each other in such a way that said pair of MOSFETs in said bias circuit are turned "on".

11. A static memory according to claim 6, further including:
    a plurality of MOSFETs for applying bias voltages to the respective paired data lines, said bias voltages having values lowered with respect to said power source voltage fed to said power source line, and
    a plurality of resistance elements which are connected between said respective paired data lines and said reference potential point of the circuitry.

12. A static memory comprising:
    a plurality of static memory cells which are arranged in the form of a matrix and each of which has a selection terminal and a pair of data terminals,
    a plurality of word lines each of which is connected in common to the selection terminals of the static memory cells,
    a plurality of paired data lines each of which is connected in common to the paired data terminals of the static memory cells,
    a pair of common data lines,
    a switch circuit which couples the paired data lines, to be selected among said plurality of paired data lines, to said pair of common data lines,
    a sense amplifier which has a pair of input terminals coupled to said pair of common data lines,
    a bias circuit connected between a power source line and said pair of common data lines which includes a MOSFET for applying bias voltages to said pair of common data lines, said bias voltages having values lowered with respect to a power source voltage fed to said power source line, and
    first and second resistance means connected between the respective common data lines and a reference potential point of the circuitry for coupling a current, of a value substantially equal to or somewhat greater than a leakage current developed by said MOSFET, between said MOSFET and said reference potential point.

13. A static memory according to claim 12, wherein said first and second resistance means are constructed of polycrystalline silicon layers.

14. A static memory according to claim 12, wherein said first and second resistance means are constructed of MOSFETs.

15. A static memory according to claim 12, wherein said sense amplifier is constructed of a pair of differential MOSFETs, a constant-current element which couples a constant current to sources of said differential MOSFETs connected in common, and load elements which are connected to drains of said differential MOSFETs.

16. A static memory according to claim 15, wherein said sense amplifier is constructed of a CMOS circuit.

17. A static memory according to claim 12, further including:
    a plurality of MOSFETs for applying bias voltages to the respective paired data lines, said bias voltages having values lowered with respect to said power source voltage fed to said power source line, and
    a plurality of resistance elements which are connected between said respective paired data lines and said reference potential point of the circuitry.

18. A static memory comprising:
    a plurality of static memory cells which are arranged in the form of a matrix and each of which has a selection terminal and a pair of data terminals,
    a plurality of word lines each of which is connected in common to the selection terminals of the static memory cells,
    a plurality of pairs of data lines, each pair being connected in common to the data terminals of the static memory cells,
    a pair of common data lines,
    a switch circuit which couples one pair of data lines, to be selected amonth said plurality of pairs of data lines, to said pair of common data lines,
    a sense amplifier which has a pair of input terminals coupled to said pair of common data lines, a plurality of MOSFETs connected between a power source line and the respective data lines which apply bias voltages to the respective data lines, said bias voltages having values lowered with respect to a power source voltage fed to said power source line, and a plurality of resistance elements which are connected between said respective data lines and a reference potential point of the circuitry for coupling a current, of a value substantially equal to or somewhat greater than a leakage current developed by said plurality of MOSFETs, between said MOSFET and said reference potential point.

* * * * *